United States Patent [19]
Tuminaro et al.

[11] Patent Number: 5,627,484
[45] Date of Patent: May 6, 1997

[54] CMOS SENSE AMPLIFIER

[75] Inventors: Arthur D. Tuminaro, LaGrangeville; Yuen H. Chan, Poughkeepsie; Philip T. Wu, Wappingers Falls, all of N.Y.

[73] Assignee: International Business Machines Corporation, Armonk, N.Y.

[21] Appl. No.: 525,046

[22] Filed: Sep. 8, 1995

[51] Int. Cl.$^6$ .................................................. H03F 3/45
[52] U.S. Cl. .................... 327/56; 327/52; 327/54; 327/55
[58] Field of Search ........................... 327/52, 54–56

[56] References Cited

U.S. PATENT DOCUMENTS

| | | | |
|---|---|---|---|
| 4,274,147 | 6/1981 | Padgett et al. | 365/189 |
| 4,386,420 | 5/1983 | Ong | 365/208 |
| 4,388,705 | 6/1983 | Sheppard | 365/210 |
| 4,645,954 | 2/1987 | Schuster | 307/475 |
| 4,804,871 | 2/1989 | Walters | 327/57 |
| 4,931,675 | 6/1990 | Iwata | 327/56 |
| 5,237,533 | 8/1993 | Papaliolios | 365/207 |
| 5,461,713 | 10/1995 | Pascucci | 327/56 |

OTHER PUBLICATIONS

IBM Tech. Disc. Bul. vol. 34 No. 10A Mar. 1992 "Combined Sense Amplifier and LSSD Latch" 327/57.

*Primary Examiner*—Margaret Rose Wambach
*Attorney, Agent, or Firm*—Varnum, Riddering, Schmidt & Howlett LLP; Lynn L. Augspurger

[57] ABSTRACT

A memory sense amplifier includes a latch formed for interconnected CMOS gates with an input gate connected to one node of the latch and a reference gate connected to the other node of the latch the reference gate has an input connected to a source of reference voltage and the reference gate and input gate are activated in response to common enable signal. When the input signal, e.g., a data signal from a memory, has a signal value lower than the reference signal value when the two gates are enabled, the reference gate will discharge the node to which it is connected more rapidly than the input gate will discharge the other node. Due to the internal cross connections of the latch, the latch will rapidly change state so as to further discharge the node to which the reference is connected and further charge the other node. In this manner, a rapidly change of state of the latch is accomplished and a binary value output is generated at the latch thereby avoiding the delay which is normally encountered due to the time required for the input signal to achieve a complete change of state.

16 Claims, 2 Drawing Sheets

CM OS SENSE AMPLIFIER

BACKGROUND OF THE INVENTION

1. Field of the Invention

The invention relates to single-ended signal sensing circuitry and more particularly to sense amplifiers for sensing single-ended memory cell readouts and providing corresponding digital output signals.

2. Background Art

A present state of the art read-only memories (ROMs) consists of a large number of individual memory cells representing a plurality of multi-bit words. The presence or absence of a gate in the memory cell determines whether the digital 1 or digital 0 state, respectively, is stored. When a particular cell is read, a small voltage signal corresponding to the state of the cell is generated on a bit line connected to a sense amplifier. The sense amplifier discriminates between the absence of gate, representative of a digital 0 state, and the presence of a gate, representative of a digital 1 state, and amplifies the received signal. High performance, high density ROMs are preferably read at a very high speed to be compatible with the very high speed microprocessors. One of the greatest impediments to high speed performance is in the circuitry for sensing and amplifying an analog array cell signal on a single bit line into a full swing digital signal. One of the major problems in rapid readout of an analog signal is the time required to discriminate between a 0 signal and a 1 signal, and the time required produce an output signal once the input signal has been properly discriminated.

Certain prior art ROM sense amplifier designs require a large bit line voltage swing to properly trigger the state of the signal detection circuitry, thus increasing the memory access time. Other prior art sense amplifier designs require two columns of "dummy" reference cells to generate an internal voltage reference to a differential sense amplifier, resulting in increased design complexity area and power. When a binary signal is read from a high speed sensory, the time required for signal transition from one binary state to the other is a significant portion of the read-out window. As a result a significant period of time is required in a sense amplifier to generate a full value binary output signal, adding a substantial delay in sensing a signal.

SUMMARY OF THE INVENTION

These and other problems of the prior art are solved in accordance with the present invention by a sense amplifier incorporating circuitry causing the sense amplifier to rapidly provide a full binary output signal by comparing the received signal with a voltage reference signal. More specifically, the circuitry in accordance with the present invention includes a CMOS latch which provides a full binary output when the input signal traverses a reference threshold. In one specific embodiment of the invention, a sense amplifier comprises a latch formed from interconnected CMOS gates and having a T node and a C node. An input gate is connected between one of C and T nodes and an amplifier ground terminal, with memory read out data being applied to the gate terminal of the input gate. The other of the C and T nodes is connected to the amplifier ground terminal via a CMOS gate having a gate terminal connected to a reference voltage. The reference voltage has a value somewhat greater than one half the high voltage signal level of the input signal but less than the expected full value of the input signal. The voltage reference signal is applied to the reference gate a period of time after the input signal is expected to change state. This period of time is sufficiently long to assure that the input signal has had time to change in the direction of the next binary state. If at that time the value of the input signal is less than the value of the reference signal, it is assumed that the input signal is changing state from a high state to a low state. Because the voltage at the gate input of the reference gate is higher than the voltage on the gate input of the data input gate, the node to which the reference gate is connected will be discharged at a faster rate than the node to which the input gate is connected. As a result, the latch will change state pulling the more rapidly discharging node to a lower value and causing the other node to remain high, thereby rapidly changing the state of the latch and providing an early output from the sense amplifier. Advantageously, a full binary level output signal is provided by the sense amplifier with a minimum delay.

In accordance with a particular embodiment of the invention the latch input gate and the reference gate have sink terminals connected to a common node which is connectable to ground via a latch enable gate which responds to an enable signal. This assures that the gate with the higher level input signal will be the controlling gate in controlling the change of state of the latch. In accordance with a particular aspect of the invention, application of the input signal to the input gate is controlled by a window signal.

In a particular embodiment of the invention the latch comprises a first pair of serially connected CMOS gates and a second pair of serially connected CMOS gates. A latch node is defined between each serially connected pair of gates, and the latch node defined by each pair of gates has a connection to the gate terminals of the other pair of gates, thereby forming a latch in a standard fashion. The nodes of the flip flop are connected to a charge circuit and are periodically charged. One of the nodes is connected via the reference gate to a common node and the other is connected via the input gate to the same common node, with the common node being connected to ground via a further gate in response to an enable input signal. One of the nodes of the flip flop is connected via an amplification stage and a pass gate to an amplifier output node. The amplifier output node is connected to an output latch which maintains the state of the amplifier output node until a change of state of the output node is dictated by a change of state of the input signal. An amplification circuit is connected to the amplifier output node to provide a full binary value output data signal.

BRIEF DESCRIPTION OF THE DRAWING

The invention is described below with reference to the drawing wherein.

DETAILED DESCRIPTION

Figure 1:
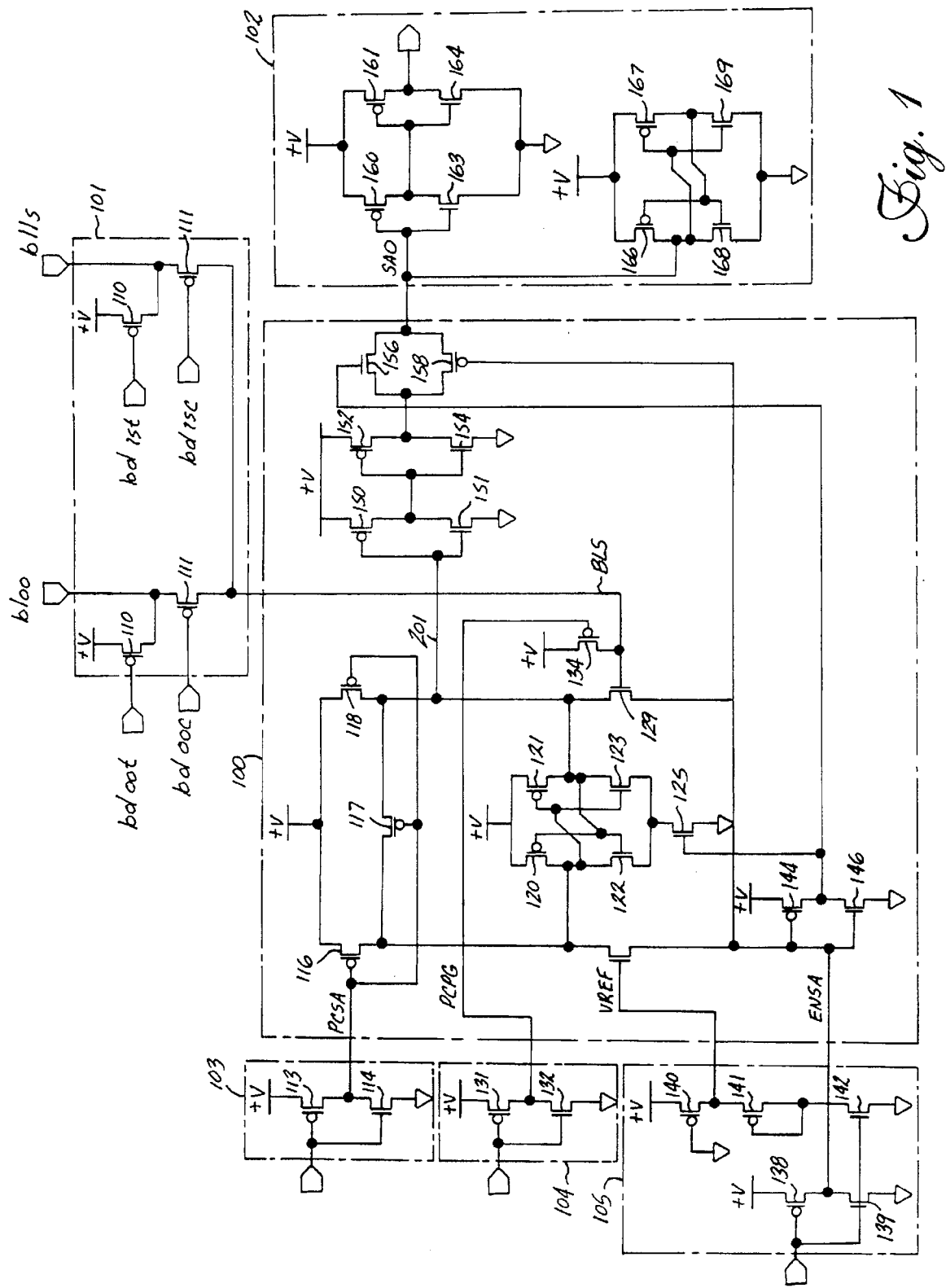
FIG. 1 is a circuit diagram representation of a sense amplifier in accordance with the present invention.

As shown in FIG. 1, the circuit of the invention comprises a sense amplifier latch circuit 100 having a conductor BLS connected to a ROM array cell output circuit 101. The latch circuit 100 has an output conductor SAO connected to an output circuit 102. A precharge circuit 103 is used to precharge the nodes of a latch in the latch circuit 100. A gate circuit 104 is responsive to a periodic timing signal to precharge conductor BLS allowing the latching circuit 100 to respond to the signal on conductor BLS. An enable circuit 105 periodically generates an enable output signal on conductor ENSA and a reference voltage on conductor VREF.

Signals on these two conductors together control the latching of the signal sensed from the conductor BLS and the generation of an output signal on conductor SAO.

Figure 2:
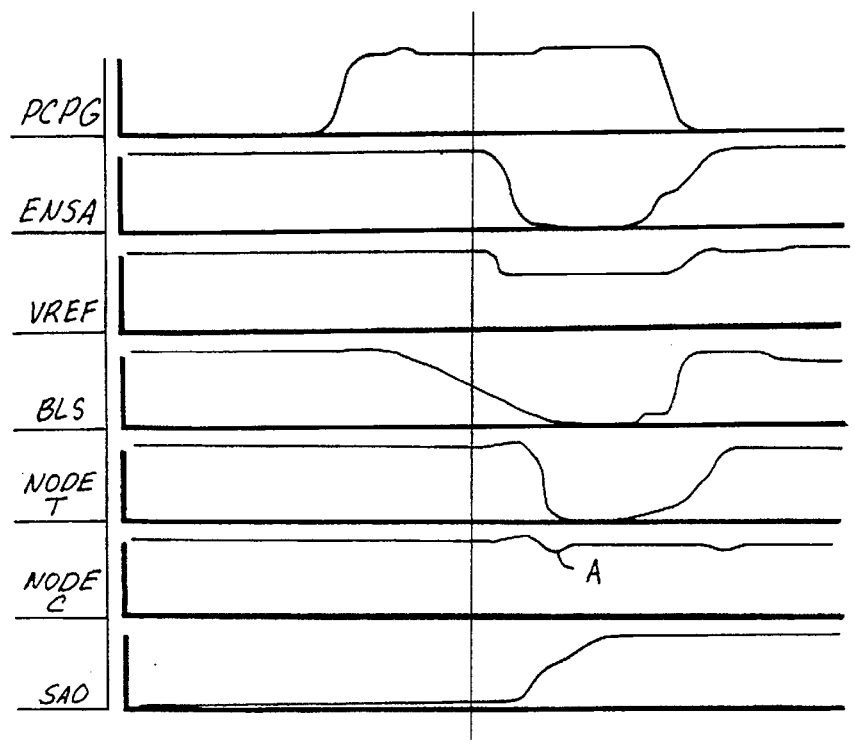
FIGS. 2 and 3 are signal timing diagrams showing the operation of various elements of the circuit of FIG. 1.
Figure 3:
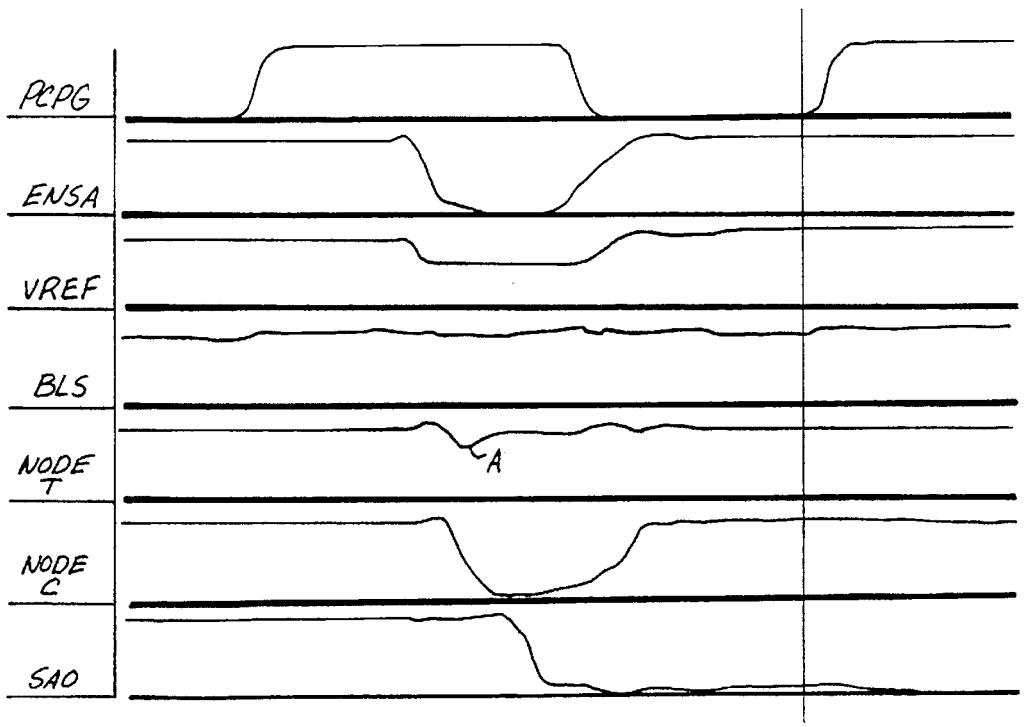

FIGS. 2 and 3 are signal timing diagrams showing the states of signals on various conductors of FIG. 1 in response to logical 0 and logical 1 inputs, respectively, on input conductor BLS.

Referring again to FIG. 1, the circuit employs a plurality of P-type and N-type CMOS gates, which will be referred to as P-type gates and N-type gates, respectively. The input circuit 101 comprises a plurality of transfer gates including P-type gates 110 having gate inputs connected to true outputs of a bit line decoder (not shown in the drawing) via conductors bd00t through bd15t and P-type gates 111 having gate inputs connected to complement outputs of the bit line decoder via conductors bd00c through bd15c. Conductors b100 through b115 are connected to memory bit line conductors and are normally precharged to a high logic level. The bit line decoder selects one of the sixteen bit lines b100–b115 by applying a high signal to one of the conductors bd00t through bd15t and a low signal to the corresponding one of the conductors bd00c through bd15c. In this manner, the state of only the selected line is transferred to conductor BLS.

The latch circuit 100 comprises a standard CMOS latch consisting of P-type gates 120, 121 and N-type gates 122, 123. Prior to activation of one of the bit line b100 through b115, the nodes T and C of the latch are precharged from the precharge circuit 103. The circuit 103 consists essentially of an inverter comprising P-type gate 113 and N-gate 114, serially connected between the system voltage source +V and ground. A signal from this circuit on conductor PCSA causes nodes and T and C to be charged from the system voltage source +V. Conductor PCSA is connected to the gate inputs of P-type gates 116,117 and 118. Gates 116 and 118 are connected between +V and on nodes T and C, respectively, and gate 117 is connected between nodes T and C. The gate control circuit 104 consisting of an inverter circuit, comprising P-type gate 131 and N-type gate 132, provides a signal on conductor PCPG connected to the gate input of P-type gate 134. Gate 134, connected between +V and conductor BLS forms a precharge circuit for the conductor BLS. Gate 134 controls the application of bit line signals to the latch in response to a change of state of conductor PCPG, as depicted in FIG. 2.

The enable circuit 105 is responsive to an enable input signal to provide a low going signal on conductor ENSA by operation of the inverter consisting of P-type gate 138 and N-type gate: 139, serially connected between +V and ground. The enable input signal also provides a reference voltage on conductor VREF by operation of P-type gates 140, 141 and N-type gate 142. These three gates are connected in series between +V and ground with the gate input of gate 140 connected to ground, the gate input of gate 141 connected to the junction between gates 141 and 142, and the gate input of gate 142 receiving the enable input signal. Conductor VREF is connected to the junction of gates 140 and 141 to provide a reference voltage at the junction between gates 140 and 141. The value of the reference voltage may be adjusted in a standard fashion by proper selection of gates 140 and 141 and is preferably such that the voltage on conductor VREF drops substantially frown a higher voltage, e.g., 2.25 volts to a lower voltage, e.g., 1.8 volts when the N-type gate 142 is switched to the conducting state. In one specific embodiment of the invention, the voltage level on conductor BLS is at approximately 2.3 volts in the binary 1 state and at approximately 1 volt in the binary 0 state. Thus, when gate 142 is conducting, the level of conductor VREF is below the: 1 state of conductor BLS and above the 0 state of conductor BLS.

As shown in FIG. 2, sensing begins when the gating conductor PCPG has changed from a low state to a high state shutting off gate 134. The states of the conductors ENSA and VREF are activated at a later time delayed from the turning off of gate 134 via conductor PCPG. Preferably, the conductors ENSA and VREF change state a period of time after activation of the PCPG lead to be able to ascertain that the BLS lead is changing state, e.g., when the voltage level on conductor BLS has dropped by a predefined amount. The timing of the PCPG, ENSA, and VREF may be adjusted relative to the signal on BLS to assure proper timing relative to the voltage change on conductor BLS.

When the enable signal is applied to the input of enable circuit 105, conductor ENSA assumes a low voltage level, e.g., near zero and conductor VREF changes from a high voltage level state to an intermediate voltage level state. If the data input received at the input circuit 101 is a logical one, the BLS lead will change to a low logic level state. As depicted in FIG. 2, the conductor VREF will assume the reference voltage (e.g. 1.8 volts) and the voltage level of conductor ENSA will drop to a near zero voltage. In the meantime, the voltage level on conductor BLS is reduced but may not have reached its low voltage level. In that case, the voltage level of conductor BLS will be below that on conductor VREF causing the latch reference gate, N-type gate 127, to turn on and draw a current from the node T of a greater magnitude than the current drawn by the latch input gate, N-type gate 129, from the node C. Thus, a voltage difference between nodes T and C will develop causing P-type gate 121 to keep node C high and N-type gate 123 to stay off by virtue of the connection between the inputs of these gates and node T. Additionally, P-type gate 120 will be kept off. This voltage difference between nodes T and C will be further amplified when N-type gate 125, a latch enable gate connected between N-type gates 122, 123 and ground, is turned on in response to the change of conductor ENSA from the high logic state to the low logic state. This change on conductor ENSA activates gate 125 by operation of the inverter circuit consisting of P-type gate 144 and N-type gate 146 which has an output connected to the gate input of the N-type gate 125. The current carrying capability of the P-type gate 121 is preferably relatively high to allow a rapid charge of the node C and, therefore, a relatively rapid change of the latch (consisting of the P-types gate. 120 and 121 and N-type gates 122 and 123) to the position wherein node T is low. The N-type gate 129 is preferably considerably smaller than P-type gate 121, to assure that the C node retains the high state. The N-type gate 125 is preferably a relatively large current carrying capacity gate.

The node C is connected via conductor 201 to the gate inputs of an inverter consists of P-type gate 150 and N-type gate 151 and connected between the system voltage source and ground. The output of that inverter is connected to the input of a further inverter connected between the system voltage source and ground and consisting of P-type gate 152 and N-type gate 154. The inverters consisting of gates 150, 151, and 152, 154 serve as an amplification stage. A pass gate consisting of N-type gate 156 and P-type gate 158 having their source and sink terminals interconnected. The source terminals are connected to the output of the inverter consisting of gates 152 and 154 and the sink terminals connected to output lead SAO. The gate input of gate 156 is connected to the output of the inverter consisting of gates 144 and 146 and the gate input of gate 158 is connected to the conductor ENSA. Thus, the pass gate is activated only when a low-going pulse appears on the conductor ENSA.

The output conductor SAO is connected to an output buffer in output circuit 102 consisting of a pair of interconnected inverters. consisting of P-type gates 160, 161 and N-type gates 163, 164. The conductor SAO is connected to gate inputs of P-type gate 160 and N-type gate 163 serially connected between the system voltage source and ground to form the first inverter of the pair. The output of the first inverter is connected to the gate inputs of P-type gate 161 and N-type gate 164, also connected between the system voltage source and ground and forming the second converter of the pair. The output of the second inverter is the data output of the circuit. As mentioned earlier, a data input representing a logical one will result in a low-going voltage on conductor BLS. Due to the relative voltage differences between conductors VREF and BLS, the node C will assume a high logic state and, consequently, the output SAO will also assume a high voltage level, indicative of the high logic state. A double inversion takes place in the buffer circuit consisting of the two inverters, which also provides further amplification.

An output latch consisting of P-type gates 166, 167 and N-type gates 168, 169 is connected to the SAO lead to latch and maintain the state of the SAO lead when the state of the ENSA conductor changes from a low logical level to a high logic level state.

As is apparent from FIG. 2. gating conductor PCPG is first activated allowing the conductor BLS to begin to drop toward a low level in the event of logical 1 data input. Subsequently, conductors ENSA and VREF are activated. This allows node T to drop to a low logic level, keeping node C to a high logic level. Since BLS has not fully reached the low logic level when ENSA is activated, node C begins to drop due to operation of gate 129. However, due to the difference in size of gates 121 and 129, node C recovers, as depicted at A in FIG. 2. Conductor SAO rises to a high logic level with minimal delay from activation of ENSA and retains that state by virtue of the output latch until a change of state in the input signal.

The operation of the circuit of FIG. 1 is described in the previous paragraphs, with reference to FIG. 2, for the case in which the data sensed by the sense amplifier represents a logical one. FIG. 3 depicts voltage levels on these conductors when the data input is a logical zero. Referring to FIG. 3, the states and change of states of the conductors PCPG, ENSA, and VREF are the same as in FIG. 2. When the data input applied to the circuit is a logical zero, the state of the BLS lead does not change and remains as a high logic level, e.g., greater than two volts when PCPG is activated. The voltage on conductor VREF will change to the earlier-mentioned lower voltage level, e.g., 1.8 volts, when the conductor ENSA is changed from the high logic level to the low logic level. In this case, the N-type gate 129 will turn on before the N-type gate 127 because the voltage difference between conductors BLS and ENSA is greater than that between conductors VREF and ENSA. As a consequence, when N-type gate 129 is turned on, node C is pulled low, causing P-type gate 120 to be turned on and N-type gate 122 to be kept off. Accordingly, the voltage level of node T is kept high causing P-type gate 121 to be kept off, and N-type gate 123 to be turned on, thereby further reducing the voltage level at node C when gate 125 is turned on. The level of the node C is reflected on conductor 201 and on conductor SAO, in a manner described previously. The low logic level signal on conductor SAO is latched in the output buffer 102 and transmitted to the data output terminal. FIG. 3 shows the change of state of conductor SAO and at A depicts the temporary drop in voltage level of node T due to activation of gate 127 in response to the signal on conductor VREF. (Gate 120 is relatively large, e.g., 30 microns and gate 127 is relatively small, e.g., 6 microns. Hence, node T recovers when gate 120 is in the full conducting state. The P-type gate 138 and N-type gates 139, 142 in the enable circuit 105 are preferably relatively large gates, e.g., on the order of 40 microns each. These gates are chosen to assure good reference voltage tracking.

It will be understood that the above-described arrangement is merely illustrative of the application of the principals of the invention and that other arrangements may be devised by those skilled in the art without departing from the scope of the invention as defined by the appended claims.

What is claimed is:

1. A sense amplifier comprising:

a latch formed from interconnected CMOS gates and having a pair of latch nodes;

charge circuitry for selectively charging the latch nodes;

a latch input gate connected between a first of the latch nodes and an amplifier ground terminal and a latch reference gate connected between a second of the latch nodes and the amplifier ground terminal;

a source of reference voltage connected to the latch reference gate and generating a reference voltage signal of a predetermined value;

an input conductor connected to the latch input gate providing an input signal to the input gate having a high voltage level state greater than the predetermined value and a low voltage level value lower than the predetermined state;

the latch input gate operative to discharge the first node when the high voltage level state input signal is provided on the input conductor and the latch reference gate operative to discharge the second node when the low voltage level state is provided on the input conductor.

2. The sense amplifier in accordance with claim 1 and further comprising latch enable gate connected between the interconnected CMOS gates and the amplifier ground terminal and latch enable circuitry responsive to an enable input signal to selectively activate the latch reference gate and the latch enable gate.

3. The sense amplifier in accordance with claim 1 and further comprising a input control circuit responsive to a gating signal to selectively enable the latch input gate to respond to the input signal.

4. The sense amplifier in accordance with claim 1 wherein the latch comprises first and second P-type CMOS gates and first and second N-type CMOS gates, the first and second P-type CMOS gates each having a source terminal connected to an amplifier voltage source terminal and the first and second N-type CMOS gates each having a sink terminal connected to the amplifier ground terminal, the first and second P-type CMOS gates having a current carrying capacity substantially greater than current carrying capacity of the latch input gate and the latch reference gate.

5. The sense amplifier in accordance with claim 4 wherein the current carrying capacity of the first arid second P-type gates is at least twice as great as the current carrying capacity of the either the latch input gate or the latch reference gate.

6. The sense amplifier in accordance with claim 1 and further comprising an amplifier output terminal and a pass gate circuit having an input connected to one of the latch nodes and an output connected to the amplifier output terminal, the pass gate responsive to the enable input signal to gate a signal from the latch to the amplifier output terminal.

7. The sense amplifier in accordance with claim 6 and further comprising an output latch connected to the output of the pass gate and responsive to an output signal of a first polarity on the output of the pass gate to provide an output signal of the first polarity on the amplifier output terminal until the output of the pass gate is changed from the first polarity to a second polarity.

8. The sense amplifier in accordance with claim 7 and further comprising an output amplification circuit connected between the output of the pass gate circuit and the amplifier output terminal.

9. The sense amplifier in accordance with claim 7 and further comprising an amplification circuit connected between the one of the latch nodes and the pass gate.

10. The sense amplifier in accordance with claim 1 wherein the charge circuitry comprises first and second charge gates connected to between a system voltage source and the first and second latch nodes, respectively, and a third charge gate connected between the first and second latch nodes.

11. A sense amplifier comprising:

a sense amplifier latch formed from first and second CMOS gates serially connected between an amplifier voltage source terminal and a common node and third and fourth CMOS gates serially connected between amplifier voltage source terminal and the common node, the sense amplifier latch having a first latch node between the first and second CMOS gates and a second latch node between the third and fourth CMOS gates, the first latch node connected to a gate terminal of each of the first and second CMOS gates and the second latch node connected to a gate terminal of each of the third and fourth CMOS gates;

charge circuitry responsive to a charge control signal for periodically charging the first and second latch nodes;

a latch input gate connected between the first latch node and an amplifier ground terminal and a latch reference gate connected between the second latch node and the amplifier ground terminal;

a source of reference voltage connected to the latch reference gate and responsive to an amplifier enable signal to generate a reference voltage signal of a predetermined value;

an input conductor connected to the latch input gate providing an input signal on the input conductor having a high voltage level state greater than the predetermined value and a low voltage level value lower than the predetermined state;

a latch enable gate connected between the common node and the amplifier ground terminal and responsive to the amplifier enable signal to connect the common node to the amplifier ground terminal;

the input gate responsive to the input signal to discharge the first node when a high voltage level state input signal is provided on the input conductor and the sense amplifier latch responsive to the discharge of the first node to assume a first binary state;

the latch reference gate responsive to the reference voltage signal to discharge the second node when a low voltage level state input signal is provided on the input conductor and the sense amplifier latch responsive to the discharge of the second node to assume a second binary state;

a sense amplifier output terminal and an output amplification circuit having an input terminal connected to a selected one of the first and second latch nodes and having an output terminal connected to the sense amplifier output terminal for amplifying a signal representative of the binary states of the selected one of the first and second latch nodes.

12. The sense amplifier in accordance with claim 11 and further comprising an output latch connected between the selected one of the first and second nodes for latching the state of the sense amplifier latch.

13. A method of sensing the state of an input signal in a sense amplifier, the method comprising the steps of:

providing a sense amplifier latch formed from first and second CMOS gates serially connected between an amplifier voltage source terminal and a common node and third and fourth CMOS gates serially connected between the amplifier voltage source terminal and the common node, the sense amplifier latch having a first charged latch node between the first and second CMOS gates and a second charged latch node between the third and fourth CMOS gates, the second latch node connected to a gate terminal of each of the first and second CMOS gates and the second latch node connected to a gate terminal of each of the third and fourth CMOS gates;

connecting a first discharge gate to the first latch node and connecting a second discharge gate to the second latch node;

applying an input signal varying between first and second signal values over time to the first discharge gate;

applying a reference signal having a predetermined signal value falling between the first and second signal values to the second discharge gate;

discharging the first latch node via the first discharge gate when the value of the input signal is greater than the predetermined value; and discharging the second latch node via the second discharge gate when the value of the input signal is less than the predetermined.

14. A sense amplifier comprising:

an amplifier input terminal for connection to a memory array output terminal;

a latch formed from interconnected CMOS gates and having first and second latch nodes;

charge circuitry for periodically charging the latch nodes;

an amplifier ground terminal;

a latch input gate connected between the first latch node and the amplifier ground terminal and having a control terminal connected to the amplifier input terminal;

a source of reference potential independent of the memory array and generating a reference voltage of a predetermined value;

a latch reference gate connected between the second latch node and the amplifier ground terminal and having a control input terminal connected to the source of reference potential;

the latch input gate operative to discharge the first node when the voltage level of the input signal on the amplifier input terminal is greater than the predetermined value and the latch reference gate operative to discharge the second node when the voltage level of the input signal on the amplifier input terminal is smaller than the predetermined value;

a latch enable gate connected between the latch and the amplifier ground terminal; and latch enable circuitry responsive to an enable input signal to activate the input gate and the latch reference gate prior to activating the latch enable gate.

15. The sense amplifier in accordance with claim 14 wherein the latch enable circuitry comprises circuitry for enabling; the latch reference gate, the latch input gate and the latch enable gate, and wherein the latch enable circuitry is operative to enable the latch reference gate and the latch enable gate prior to enabling the latch enable gate, whereby a voltage difference developed between the nodes of the latch by operation of the input gate and the reference gate is amplified by operation of the latch enable gate.

16. A sense amplifier for connection to a memory array output terminal and comprising:

a sense amplifier latch formed from first and second CMOS gates serially connected between an amplifier voltage source terminal and a common node and third and fourth CMOS gates serially connected between amplifier voltage source terminal and the common node, the sense amplifier latch having a first latch node between the first and second CMOS gates and a second latch node between the third and fourth CMOS gates, the first latch node connected to a gate terminal of each of the first and second CMOS gates and the second latch node connected to a gate terminal of each of the third and fourth CMOS gates;

charge circuitry responsive to a charge control signal for periodically charging the first and second latch nodes;

an amplifier ground terminal;

a latch input gate connected between the first latch node and the amplifier ground terminal;

a latch reference gate having a control input terminal and connected between the second latch node and the amplifier ground terminal;

a source of reference voltage independent of the memory array and connected to the control input terminal of the latch reference gate and responsive to an amplifier enable signal to generate a reference voltage signal of a predetermined value;

an input conductor connected to the latch input gate providing an input signal on the input conductor having a high voltage level state greater than the predetermined value and a low voltage level state less than the predetermined value;

a latch enable gate connected between the common node and the amplifier ground terminal and responsive to the amplifier enable signal to connect the common node to the amplifier ground terminal;

the latch input gate responsive to the input signal to discharge the first node when a high voltage level state input signal is provided on the input conductor and the sense amplifier latch responsive to the discharge of the first node to assume a first binary state;

the latch reference gate responsive to the reference voltage signal to discharge the second node when a low voltage level state input signal is provided on the input conductor and the sense amplifier latch responsive to the discharge of the second node to assume a second binary state;

a sense amplifier output terminal; and an output amplification circuit having an input terminal connected to a selected one of the first and second latch nodes and having an output terminal connected to the sense amplifier output terminal for amplifying a signal representative of the binary states of the selected one of the first and second latch nodes.

* * * * *